(12) United States Patent
Tseng et al.

(10) Patent No.: US 9,741,868 B2
(45) Date of Patent: Aug. 22, 2017

(54) SELF-ALIGNED SPLIT GATE FLASH MEMORY

(71) Applicant: Taiwan Semiconductor Manufacturing Co., Ltd., Hsin-Chu (TW)

(72) Inventors: Yuan-Tai Tseng, Zhubei (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/688,011

(22) Filed: Apr. 16, 2015

(65) Prior Publication Data
US 2016/0308069 A1    Oct. 20, 2016

(51) Int. Cl.
| H01L 29/78 | (2006.01) |
| H01L 29/792 | (2006.01) |
| H01L 29/66 | (2006.01) |
| H01L 21/28 | (2006.01) |
| H01L 29/423 | (2006.01) |
| H01L 27/1157 | (2017.01) |

(52) U.S. Cl.
CPC ...... *H01L 29/792* (2013.01); *H01L 21/28282* (2013.01); *H01L 27/1157* (2013.01); *H01L 29/42344* (2013.01); *H01L 29/665* (2013.01); *H01L 29/66484* (2013.01); *H01L 29/66833* (2013.01); *H01L 29/7831* (2013.01)

(58) Field of Classification Search
CPC ...... H01L 29/94; H01L 29/76; H01L 29/7831
See application file for complete search history.

(56) References Cited

U.S. PATENT DOCUMENTS

| 2007/0218633 A1* | 9/2007 | Prinz | B82Y 10/00 438/267 |
| 2007/0228498 A1* | 10/2007 | Toba | H01L 21/28282 257/411 |
| 2014/0170843 A1 | 6/2014 | Chen et al. | |
| 2015/0035034 A1 | 2/2015 | Winstead et al. | |
| 2015/0372136 A1* | 12/2015 | Chang | H01L 29/7831 257/314 |

* cited by examiner

*Primary Examiner* — Tran Tran
(74) *Attorney, Agent, or Firm* — Eschweiler & Potashnik, LLC

(57) ABSTRACT

The present disclosure relates to a self-aligned split gate memory cell, and an associated method. The self-aligned split gate memory cell has a memory gate with a flat top surface. A memory gate spacer is arranged directly above the memory gate having a lateral dimension smaller than that of the memory gate. The memory gate spacer has an inner sidewall disposed along an upper portion of a charge trapping layer and an outer sidewall recessed back laterally relative to an outer sidewall of the memory gate. In some embodiments, a dielectric liner is continuously lined the outer sidewall of the memory gate, extending on a portion of the top surface of the memory gate not covered by the memory gate spacer, and extending upwardly along the outer sidewall of the memory gate spacer.

20 Claims, 9 Drawing Sheets

SELF-ALIGNED SPLIT GATE FLASH MEMORY

BACKGROUND

Flash memory is an electronic non-volatile computer storage medium that can be electrically erased and reprogrammed quickly. It is used in a wide variety of electronic devices and equipment. To store information, flash memory includes an addressable array of memory cells having charge storage components. Common types of flash memory cells include stacked gate memory cells and split gate memory cells. Compared to stacked gate memory cells, split gate memory cells have higher injection efficiency, less susceptibility to short channel effects, and better over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
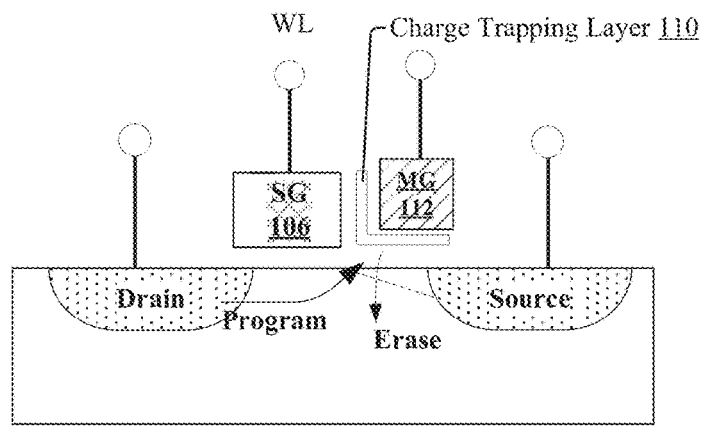
FIG. 1 illustrates a functional view of some embodiments of a split gate flash memory cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Split gate flash memories typically include an addressable array of split gate memory cells which receive, store and transmit data bits. A split gate memory cell includes a select gate (SG) and a memory gate (MG) disposed over a channel region within a substrate and separated by a charge trapping layer which traps predetermined amounts of charge corresponding to data states stored in the memory cell. To make it practical to integrate embedded flash memory with logic circuits and not cause contamination for the periphery of the chip as in previous approaches, top surface of the SGs and MGs of the memory cells of the flash memory are covered by dielectric spacers to prevent silicide formation on these surfaces when forming the silicide layer on top of source/drain regions. Conventionally, to fabricate the MGs of this kind of flash memory cell, a conductive material (memory gate material) is deposited and patterned along sidewalls of the SGs to form a MG precursor at one side of the SG. Then a dielectric spacer is formed along an outer sidewall of the MG precursor, and an upper surface of the MG precursor is then recessed to form the MG, which has an upper surface that resides beneath upper surfaces of both the SG and dielectric spacer. Because the MG upper surface is narrow, there is a small recess over the MG that is defined between sidewalls of the dielectric spacer and SG. Unfortunately, because this recess is small, voids may be formed over the MG when the recess is attempted to be filled with dielectric. As such, subsequent etches may cause damage to the underlying MG through these voids. As a result, reliability of the IC is affected.

Accordingly, the present disclosure relates to an improved integrated circuit including a split gate memory cell and associated processing methods. In the disclosed methods, instead of recessing a MG pre-cursor after the dielectric spacer has been formed (which potentially leaves problematic voids in some circumstances), the present approach lowers a MG material prior to formation of the dielectric spacers and then forms a MG spacer (cap spacer) over the top surface of the MG material. The MG spacer is used as a mask to form the MG. An outermost portion of the MG spacer is consumed during subsequent etching steps, exposing an outer portion of the top surface of the MG. A dielectric liner is then formed along a sidewall of the MG spacer, along the exposed outer portion of the top surface of the MG, and along a sidewall of the MG. In some embodiments, a sidewall spacer can be formed along and over the dielectric liner and have an upper portion extending over the exposed outer portion of the top surface of the MG. Thus, the sidewall spacer would have an upper portion wider than a lower portion. Advantageously, this process and the corresponding structures do not suffer from void formation issues as with previous processes, and therefore provide improved reliability in some regards.

Figure 2:
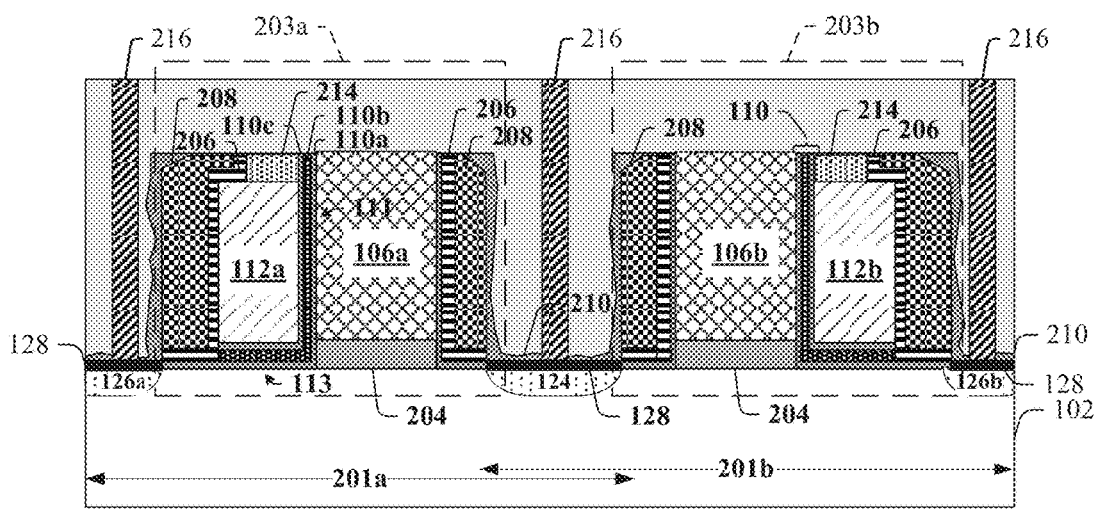
FIG. 2 illustrates a cross-sectional view of some embodiments of a pair of split gate flash memory cells.

In some embodiments, the disclosed integrated circuit can include an embedded split gate flash memory integrated with some CMOS circuitry. The split gate flash memory comprises a plurality of memory cells arranged in an array. In some embodiments, the memory cells can be arranged as a "NAND" structure, where multiple memory cells are connected in series. While in some other embodiments, the memory cells can be arranged as a "NOR" structure, where multiple memory cells are connected in parallel and every two of the memory cells can share a common source or drain region with symmetric structures to achieve a denser data storage. Though an example of a pair of memory cells sharing a common drain region is shown in FIG. 2, it should be appreciated that FIG. 2 is not limiting and any applicable memory array arrangement is amenable. Besides, the example values given below, for example, thickness or distance dimensions are under 28 nm fabrication processes, and disclosed integrated circuit and processing methods may also be suitable for other fabrication nodes.

FIG. 1 illustrates a functional view of some embodiments of a split gate memory cell 100. The split gate memory cell 100 comprises a select gate (SG) 106 and a memory gate (MG) 112 disposed laterally over a substrate between source and drain regions. The SG 106 is connected to a word line (WL) to control the access of the split gate memory cell 100. A charge trapping layer 110 is disposed between the SG 106 and the MG 112 and extends under the MG 112 to act as a charge storage component. Charges (electrons) can be injected to the charge trapping layer 110 through a channel between the source and drain regions. A low voltage can be applied to the SG 106 to form an inversion channel below the SG. While the low voltage is applied to the SG 106, a high voltage is applied to the MG 112, which attracts or repels electrons to or from the charge trapping layer 110, yielding a high injection or removal efficiency. The low SG voltage helps to minimize drain current during programming, which leads to a relative small programming power compared to standard one-transistor memories.

FIG. 2 shows a cross-sectional view of an integrated circuit 200 including a pair of split gate memory cells according to some embodiments. As will be appreciated in greater detail below, the pair of split gate flash memory cells includes a first memory cell 201a and a second memory cell 201b that reside over a semiconductor substrate 102. The first and second memory cells 201a, 201b each comprises a gate structure 203a, 203b that is arranged over a channel region separating source/drain regions 126, 124 of the memory cells 201. Thus, the first memory cell 201a includes a first gate structure 203a arranged between a first source/drain region 126a and a second source/drain region 124; and the second memory cell 201b includes a second gate structure 203b arranged between the second source/drain region 124 and a third source/drain region 126b. As an example, the second source/drain region 124 can act as a shared or common drain region for the first and second memory cells 201a, 201b, and the first and third source/drain regions 126a, 126b can act as individual source regions for the first and second memory cells 201a, 201b, respectively. In some embodiments, the gate structures 203a, 203b can be arranged symmetrically on opposite sides of the common drain region 124 and have substantially the same structures. As shown in FIG. 2, the first gate structure 203a has a first select gate 106a and the second gate structure 203b has a second select gate 106b. A first memory gate 112a corresponding to the first gate structure 203a is disposed at one side of the first select gate 106a (e.g. left side in FIG. 2 opposite to the common drain region 124). A second memory gate 112b corresponding to the second gate structure 203b is disposed at an opposite side of the second select gate 106b (e.g. right side in FIG. 2 symmetrical to the first memory gate 112a away from the common drain region 124). For purposes of simplicity, only one memory cell is described hereafter, but it will be appreciated that the other memory cell has corresponding features. Further, the nomenclature of "a" and "b", for example, as in the first and second memory cells 201a, 201b, is simplified to omit the "a" and "b"—for example reference numeral 201 refer to either the first or second memory cell.

As described above, one split gate memory cell 201 comprises a select gate (SG) 106 disposed over a semiconductor substrate 102. The SG 106 is separated from the semiconductor substrate 102 by a gate dielectric 204. A memory gate (MG) 112 is arranged at one side of the SG 106. In some embodiments, the SG 106 and the MG 112 have cuboid shapes with planar top surfaces and sidewalls, which benefit critical dimension control, spacer formation, and leakage control. In some embodiments, the SG 106 and the MG 112 comprise doped poly silicon; however, in other embodiments the SG 106 and the MG 112 can be made of other conductive materials such as metal, for example. A charge trapping layer 110 is configured to store charges and has a vertical portion 111 disposed between neighboring sidewalls of the SG 106 and the MG 112 and a lateral portion 113 extending under the MG 112. In some embodiments, the charge trapping layer 110 comprises a charge trapping component 110b (e.g. a nitride layer, or a layer of sphere-like silicon dots randomly arranged), sandwiched between a first dielectric layer 110a (e.g. a bottom oxide layer) and a second dielectric layer 110c (e.g. a top oxide layer). During operation of the memory cell 201, the first and/or second dielectric layers 110a, 110c are structured to promote electron tunneling to and from the charge trapping component 110b, such that the charge trapping component 110b can retain trapped electrons that alter the threshold voltage of the memory cell 201 in a manner that corresponds to a data state stored in the memory cell 201.

In some embodiments, a first height from an upper surface of the semiconductor substrate 102 to a top surface of the MG 112 is smaller than a second height from the upper surface of the semiconductor substrate 102 to a top surface of the SG 106. A memory gate spacer 214 is disposed directly above the MG 112 along an upper sidewall of the charge trapping layer 110. The memory gate spacer 214 helps to prevent leakage between the top surfaces of the MG 112 and SG 106. In some embodiments, the memory gate spacer 214 also serves as a self-aligned spacer for the memory gate formation. In other embodiments, the memory gate spacer 214 also protects the top surface of the MG 112 from silicide during a silicide process of source/drain regions 124, 126. In some embodiments, the memory gate spacer 214 can be made of silicon nitride. The memory gate spacer 214 may have a lateral dimension smaller than that of the MG 112 underneath. The memory gate spacer 214 has an inner sidewall (adjacent to the charge trapping layer 110) which is vertically aligned with that of the MG 112; and has an outer sidewall (opposite to the charge trapping layer 110) which is recessed back laterally from an outer sidewall of the MG 112, exposing a peripheral portion of the top surface of the MG 112. In some embodiments, the peripheral portion of the top surface of the MG 112 that is exposed can have a lateral dimension in a range of from about 10 Å to about 200 Å. A dielectric liner 206, for example, made of silicon dioxide, may be disposed along a portion of the upper surface of the semiconductor substrate 102 that is between the charge trapping layer 110 and the source/drain region 126, continuously along the outer sidewall of the MG 112, overlying the exposed peripheral portion of the top surface of the MG 112, and extending upwardly along the outer sidewall of the memory gate spacer 214. In some embodiments, the dielectric liner 206 can have a width in a range of from about 5 Å to about 50 Å. A sidewall spacer 208 can be disposed along the dielectric liner 206 and overlying the peripheral portion of the top surface of the MG 112. The sidewall spacer 208 can be made of silicon nitride and has an upper portion extending over the MG 112 and being wider than a lower portion.

In some embodiments, the dielectric liner 206 and the sidewall spacer 208 can be further disposed along the other side of the SG 106 opposite to the MG 112. The dielectric liner 206 can be disposed over a portion of the upper surface of the semiconductor substrate 102 that is between the SG 106 and the common drain region 124, and extend upwardly along an outer sidewall (opposite to the charge trapping layer 110) of the SG 106. The sidewall spacer 208 can sit on the dielectric liner 206 and have an outer sidewall aligned with that of the dielectric liner 206. In some embodiments, upper surfaces of the sidewall spacer 208, the dielectric liner 206, the memory gate spacer 214 and the SG 106 are co-planar as a result of a planarization process. Outer sidewalls of the charge trapping layer 110 and the MG 112 can be vertically aligned as a result of self-aligned patterning. In some embodiments, a silicide layer 128 can be disposed on a top surface of the source/drain regions 124, 126, and a contact etch stop layer (CESL), such as a nitride layer, 210 is disposed over the silicide layer 128 and along topology of the gate structure 203. A contact via 216 is disposed through the CESL 210 and coupled to the source/drain regions 124, 126.

Figure 3:
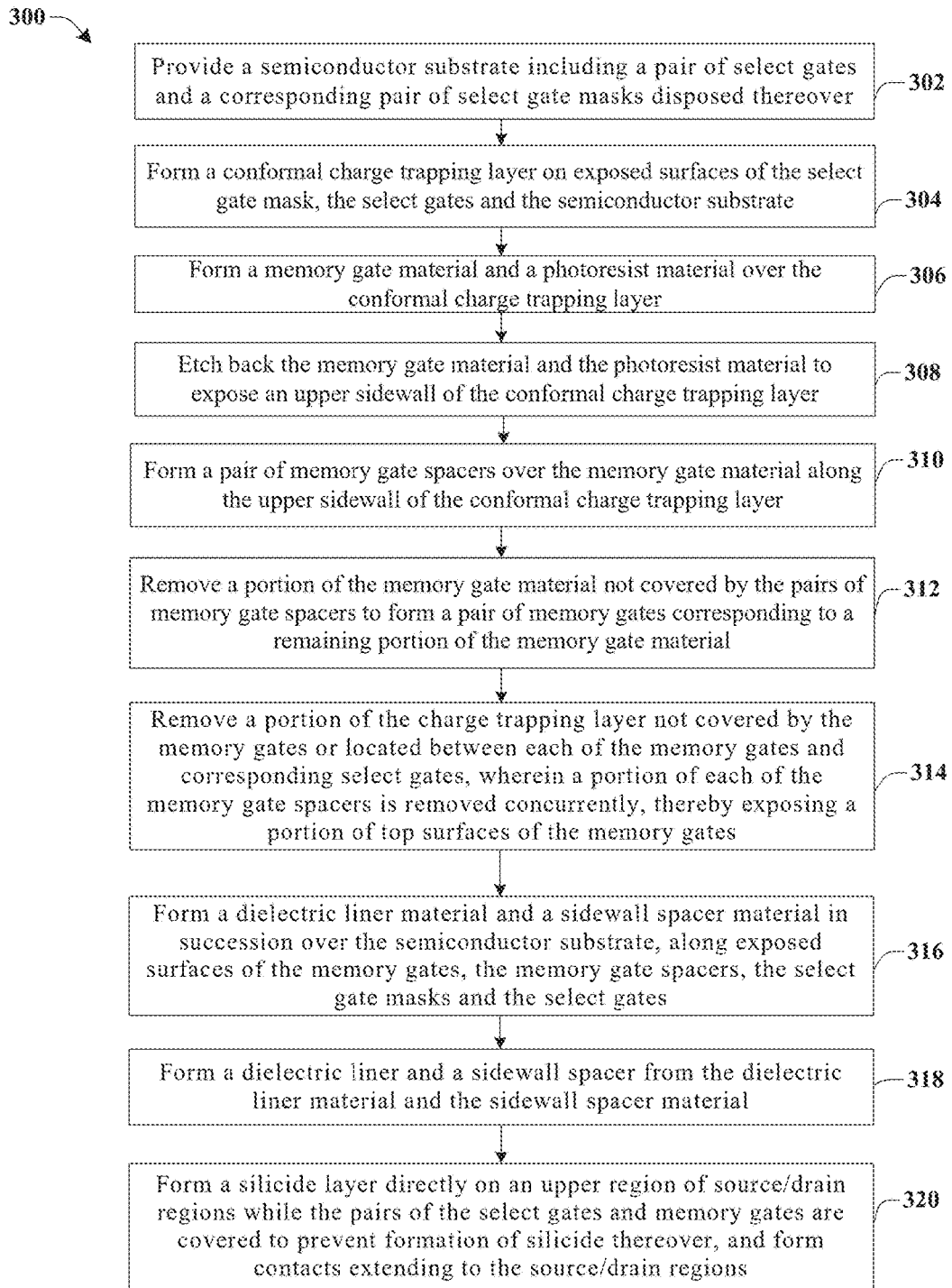
FIG. 3 illustrates a flow diagram of some embodiments of a method of forming a pair of split gate memory cells.

FIG. 3 shows a flow diagram of a method 300 of forming a split gate memory cell according to some embodiments. While disclosed methods (e.g., method 300) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At action 302, a semiconductor substrate is provided including a pair of select gates and a corresponding pair of select gate masks disposed thereover.

At action 304, a conformal charge trapping layer is formed on exposed surfaces of the select gate masks, the select gates and the semiconductor substrate. The conformal charge trapping layer is formed over an upper surface of the semiconductor substrate, along sidewalls of the select gates and the select gate masks, and over top surfaces of the select gate masks.

At action 306, a memory gate material and a photoresist material are formed in succession over the conformal charge trapping layer. The memory gate material and the photoresist material are formed by different forming techniques.

At action 308, the memory gate material and the photoresist material are etched back to expose an upper sidewall of the conformal charge trapping layer.

At action 310, a pair of memory gate spacers is formed over the memory gate material along the upper sidewall of the conformal charge trapping layer.

At action 312, a portion of the memory gate material not covered by the pairs of memory gate spacers is removed to form a pair of memory gates corresponding to a remaining portion of the memory gate material.

At action 314, a portion of the charge trapping layer not covered by the memory gates or located between each of the memory gates and corresponding select gates is removed. An outer portion of each of the memory gate spacers is removed concurrently, exposing a portion of top surfaces of the memory gates.

At action 316, a dielectric liner material and a sidewall spacer material are formed in succession over the semiconductor substrate, along exposed surfaces of the memory gates, the memory gate spacers, the select gate masks and the select gates.

At action 318, the dielectric liner material and the sidewall spacer material are etched to form a dielectric liner and a sidewall spacer.

At action 320, a silicide layer is formed directly on an upper region of source/drain regions while the pairs of the select gates and memory gates are covered to prevent formation of silicide. Contacts are then formed to ohmically couple to the source/drain regions.

FIGS. 4-17 show some cross-sectional views of a method of forming a pair of split gate memory cells according to some embodiments. Although FIGS. 4-17 are described in relation to method 300, it will be appreciated that the structures disclosed in FIGS. 4-17 are not limited to such a method.

Figure 4:
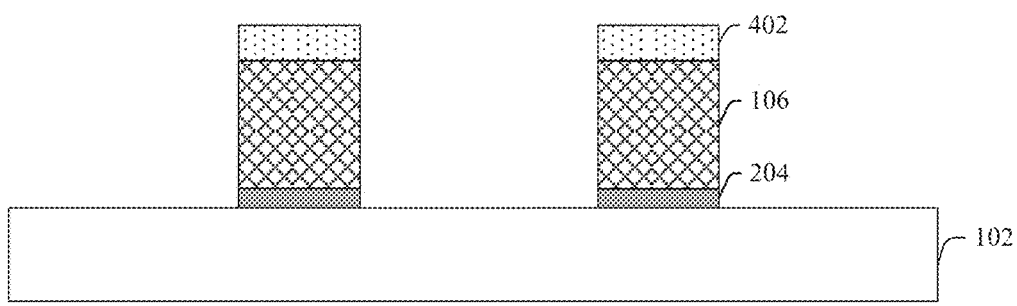
FIGS. 4-17 illustrate some embodiments of cross-sectional views of a method of forming a pair of split gate memory cells.

FIG. 4 illustrates some embodiments of a cross-sectional view 400 corresponding to act 302. As shown in cross-sectional view 400, a semiconductor substrate 102 is provided including a pair of select gates 106 and a corresponding pair of select gate masks 402 disposed thereover. A gate dielectric 204 can be disposed between the semiconductor substrate 102 and the select gates 106. The semiconductor substrate 102 is typically planar with a uniform thickness. Further, the semiconductor substrate 102 is n- or p-type, and can, for example, be a silicon wafer, such as a Si bulk wafer or a silicon-on-insulator (SOI) wafer. If present, an SOI substrate is often made up of an active layer of high quality silicon, which is arranged over a handle wafer and is separated from the handle wafer by a buried oxide layer. The gate dielectric layer 204 can be an oxide, such as silicon dioxide, or a high-k dielectric material. The select gates are made of a conductive material, such as doped polysilicon. The select gate masks often include nitrogen, and can be silicon nitride in some embodiments.

Figure 5:
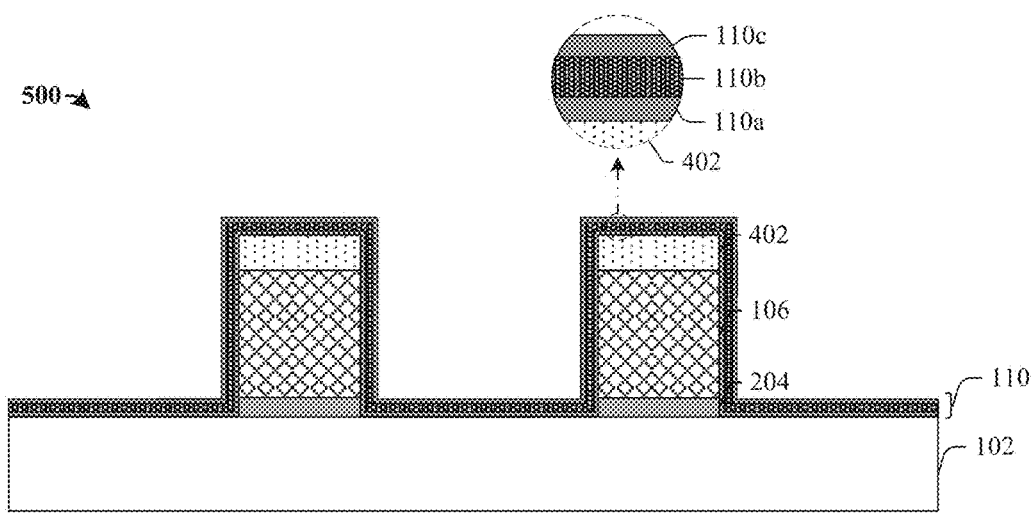

FIG. 5 illustrates some embodiments of a cross-sectional view 500 corresponding to act 304. As shown in cross-sectional view 500, a charge trapping layer 110 is formed on exposed surfaces of the select gate masks 402, the select gates 106, the gate dielectric layer 204 and the semiconductor substrate 102. In some embodiments, the charge trapping layer 110 can be formed by plasma enhanced chemical vapor deposition (PECVD), and can be made up of multiple layers, such as a charge trapping component 110b sandwiched between first and second dielectric layers 110a, 110c as shown in FIG. 5's inset. In some embodiments, the charge trapping layer 110 comprises a first oxide layer, a nitride layer, and a second oxide layer or, which can be referred to as an oxide-nitride-oxide (ONO) structure.

Figure 6:
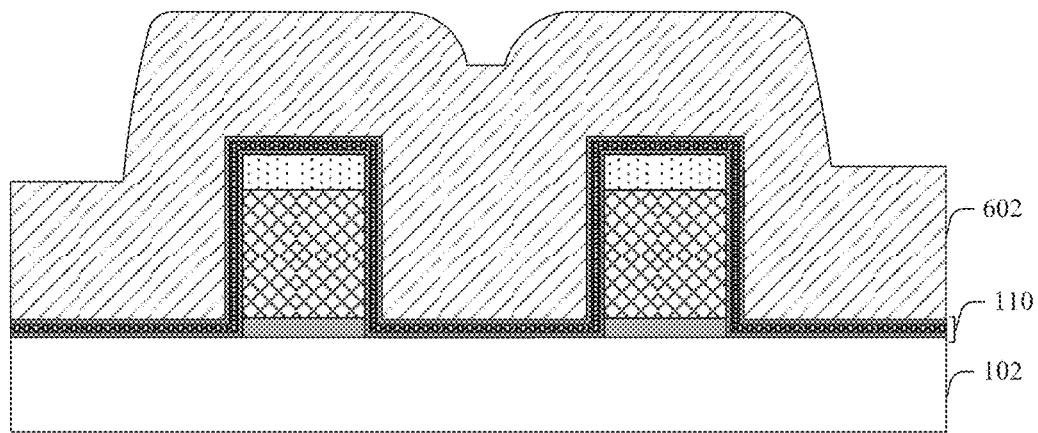
Figure 7:
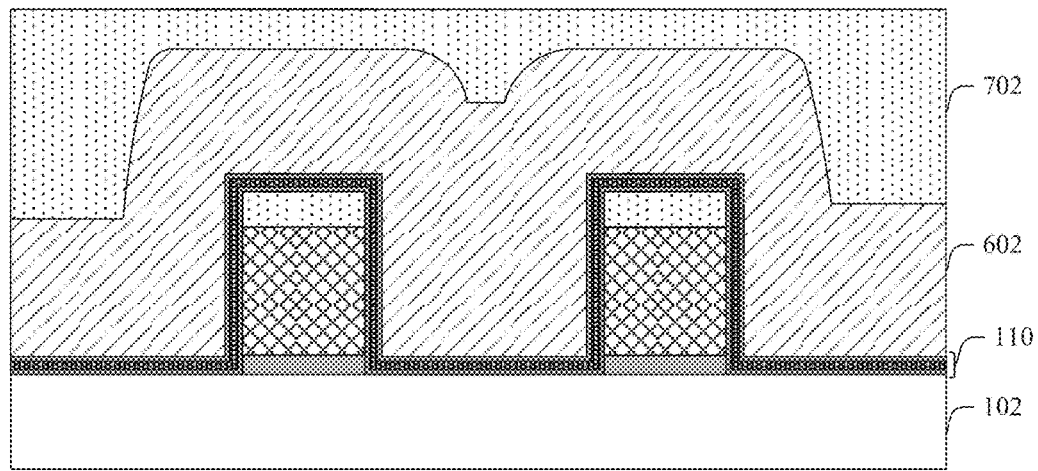

FIGS. 6-7 illustrate some embodiments of cross-sectional views 600, 700 corresponding to act 306. As shown in cross-sectional view 600, a memory gate material 602 is formed over the charge trapping layer 110. In some embodiments, the memory gate material 602 can be, for example, doped polysilicon or metal. The memory gate material 602 can be formed by deposition techniques such as chemical vapor deposition (CVD) or physical vapor deposition (PVD). A top surface of the memory gate material 602 is roughly along topology of the charge trapping layer 110 underneath. As shown in cross-sectional view 600, a photoresist material 702 is formed over the memory gate material 602. The photoresist material 702 is formed to achieve a planar top surface for subsequent etching processes. In some embodiments, the photoresist material can be formed by coating techniques such as spin-on. A top surface of the formed photoresist material 702 is substantially flat.

Figure 8:
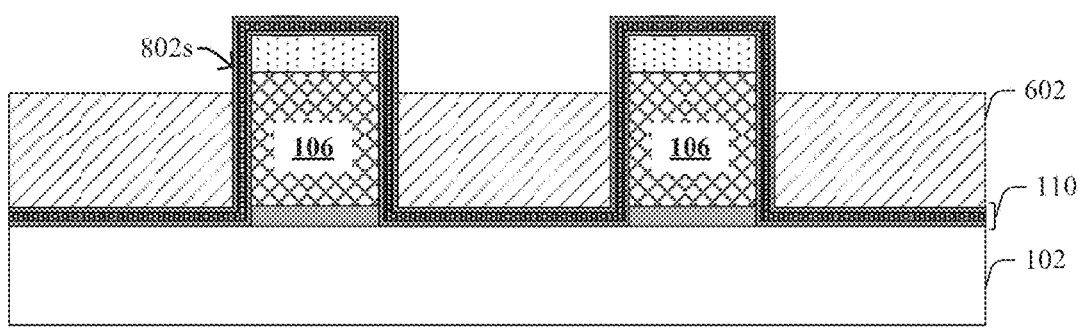

FIG. 8 illustrates some embodiments of a cross-sectional view 800 corresponding to act 308. As shown in cross-sectional view 800, the memory gate material 602 and the photoresist material 702 are etched back to non-selectively remove an upper portion thereof to expose an upper sidewall 802s of the charge trapping layer 110. As a result, the remaining memory gate material 602 has a substantially planar top surface parallel to a top surface of the semiconductor substrate 102. In some embodiments, a height of the remaining memory gate material 602 is less than that of the select gates 106. In some embodiments, the upper portion is removed by a dry etching process. Some example enchant gases include $SF_6$, HBr, $Cl_2$ and $O_2$.

Figure 9:
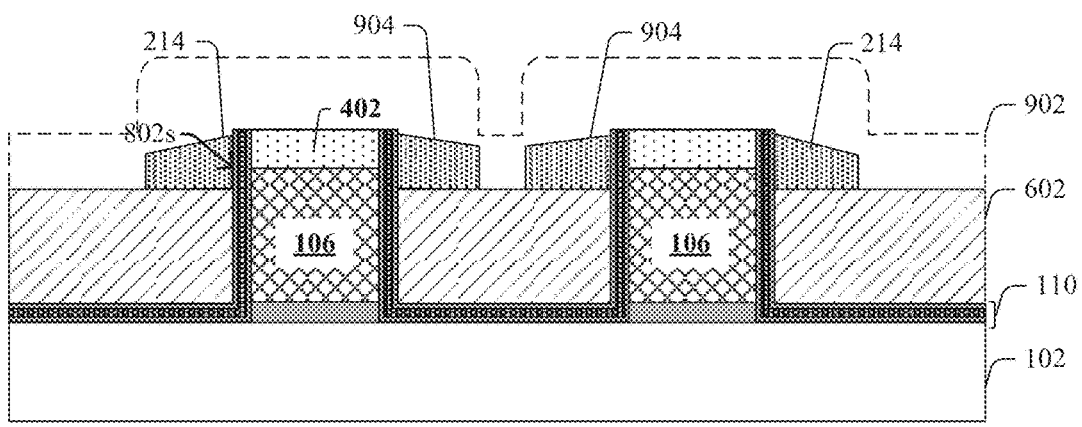

FIG. 9 illustrates some embodiments of a cross-sectional view 900 corresponding to act 310. As shown in cross-sectional view 900, a memory gate spacer material 902 is initially formed over the memory gate material 602, along the upper sidewall 802s and extending upwardly over the charge trapping layer 110. Then the memory gate spacer material 902 is etched back to remove a lateral portion thereof and to leave a vertical portion along the upper sidewall 802s of the charge trapping layer 110. The vertical portion includes a first pair of memory gate spacers 214 at opposite sides of the pair of select gates 106 and a second pair of memory gate spacers 904 at the other sides of each of the select gates 106. In some embodiments, an exposed portion of the charge trapping layer (e.g. a portion overlying the select gate masks) is at least partially consumed during the etching back process.

Figure 10:
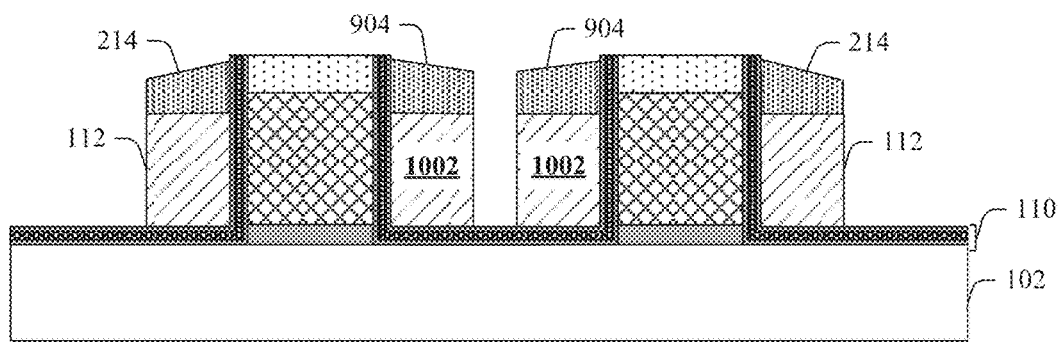

FIG. 10 illustrates some embodiments of a cross-sectional view 1000 corresponding to act 312. As shown in cross-sectional view 1000, a portion of the memory gate material 602 not covered by the first and second pairs of memory gate spacers 214, 904 is vertically removed, leaving a pair of memory gates 112 and a pair of conductive bodies 1002.

Figure 11:
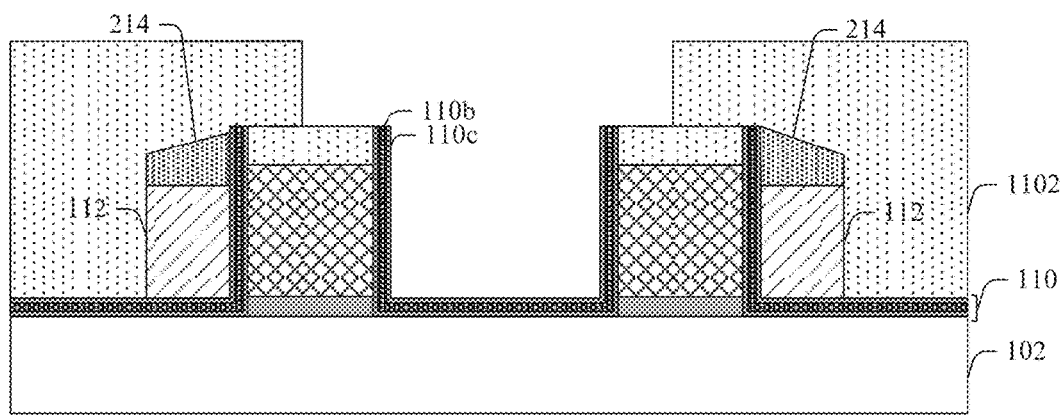
Figure 12:
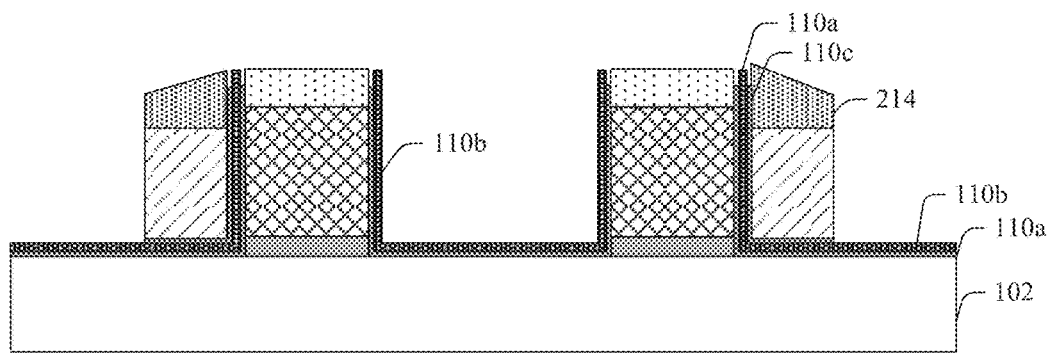
Figure 13:
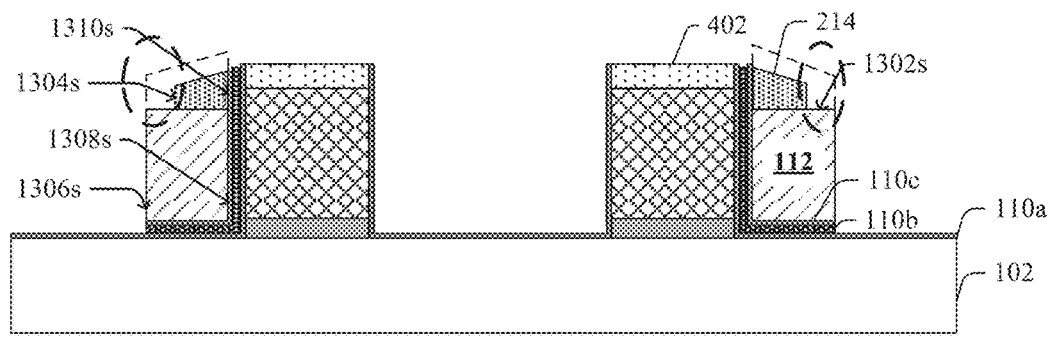

FIGS. 11-13 illustrate some embodiments of cross-sectional views 1100, 1200, 1300 corresponding to act 314. As shown in cross-sectional view 1100, the second pair of memory gate spacers 904 and the pair of conductive bodies 1002 are removed with a mask 1102 covering a peripheral region. As shown in cross-sectional view 1200, an exposed portion of the second dielectric layer 110c (not covered by the memory gates 112 and not between the memory gates 112 and the select gates 106) is removed. As shown in cross-sectional view 1300, an exposed portion of the charge trapping component 110b is removed. In some embodiments, the second dielectric layer 110c and the charge trapping component 110b are partially removed by wet etching processes. A first etching solution to remove the second dielectric layer 110c may be highly-selective to the charge trapping component 110b such that the first dielectric layer 110a is not exposed to the first etching solution to be damaged. A second etching solution to remove the charge trapping component 110b may be highly-selective to the first dielectric layer 110a to not damage the first dielectric layer 110a. As shown in cross-sectional view 1300, an outer portion (dashed line) of each of the memory gate spacers 214 is removed concurrently with the first and second etching solutions, thereby exposing a portion 1302s of the top surfaces of the memory gates 112. Outer sidewalls 1304s of the memory gate spacers 214 are recessed back from outer sidewalls 1306s of the memory gates 112. Inner sidewalls 1308s, 1310s of the memory gates 112, the memory gate spacers 214 are vertically aligned.

Figure 14:
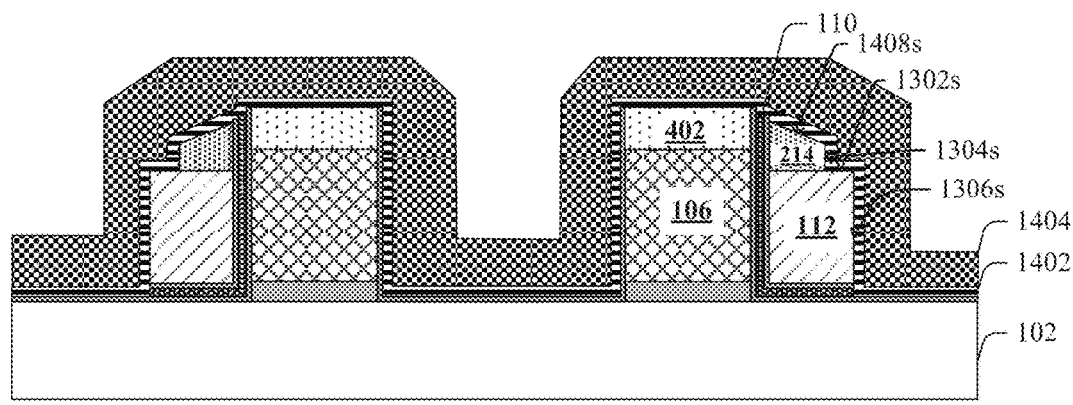

FIG. 14 illustrates some embodiments of a cross-sectional view 1400 corresponding to act 316. As shown in cross-sectional view 1400, a dielectric liner material 1402 and a sidewall spacer material 1404 are formed in succession over the semiconductor substrate 102, along exposed surfaces of the memory gates 112, the memory gate spacers 214, the select gate masks 402 and the select gates 106. The dielectric liner material 1402 abuts outer sidewalls 1306s of the memory gate spacers, the portion 1302s of the top surfaces of the memory gates 112 and outer sidewalls 1304s and tilted or tapered top surfaces 1408s of the memory gate spacers 214. In some embodiments, the dielectric liner material 1402 can be silicon dioxide formed by CVD or ALD (atomic layer deposition). The sidewall spacer material 1404 can be silicon nitride.

Figure 15:
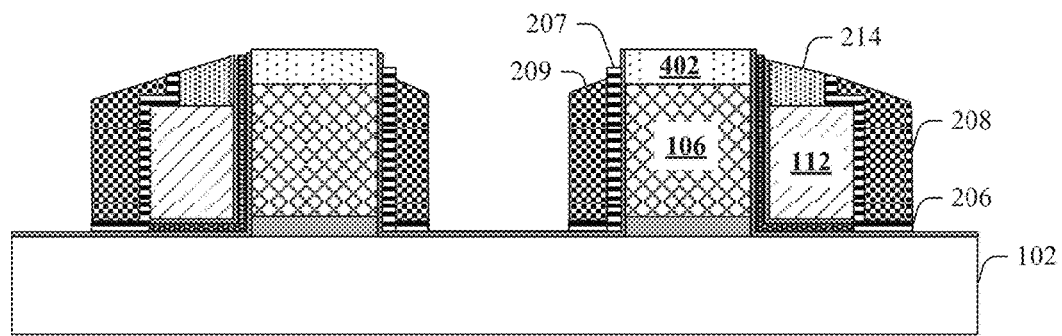

FIG. 15 illustrates some embodiments of a cross-sectional view 1500 corresponding to act 318. As shown in cross-sectional view 1500, the dielectric liner material 1402 and the sidewall spacer material 1404 are etched to form an outer and inner dielectric liner 206, 207 and an outer and inner sidewall spacer 208, 209 along sidewalls of the memory gates 112, the memory gate spacers 214, the select gate masks 402 and the select gates 106. The dielectric liner 206 can act as an etch stop layer with relatively high selectivity and enhance adhesion of the sidewall spacer 208. The outer sidewall spacer 208 has inner sidewalls abutting the dielectric liner 206 and vertical, planar outer sidewalls. The outer sidewall spacer 208 has an upper portion with a greater lateral dimension than a lower portion.

Figure 16:
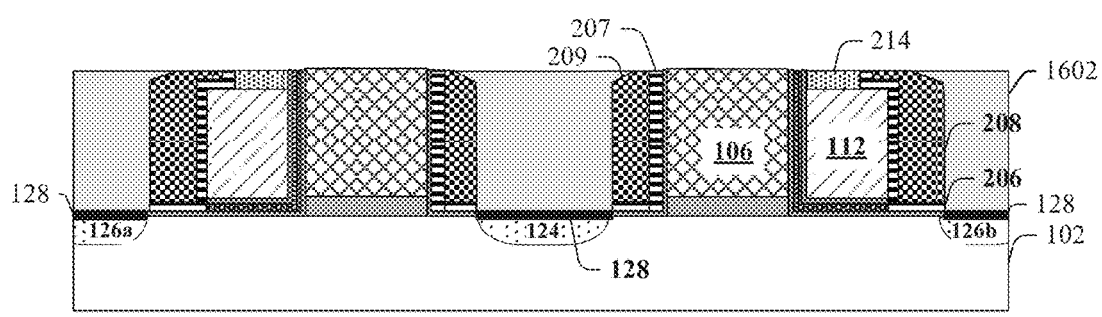
Figure 17:
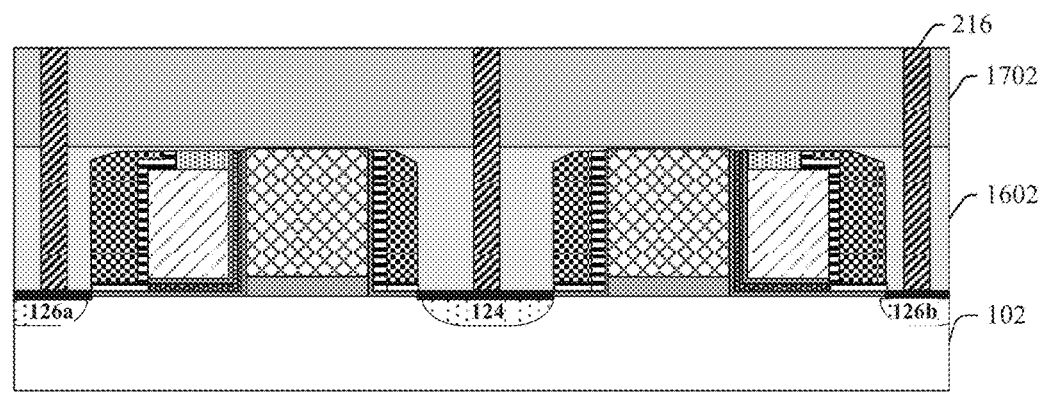

FIGS. 16-17 illustrate some embodiments of cross-sectional views 1600, 1700 corresponding to act 320. As shown in cross-sectional view 1600, a common or shared source/drain region 124 is formed in the semiconductor substrate 102 between the inner sidewall spacers 209, and individual source/drain regions 126 are formed on opposite sides of outer sidewalls of outer sidewall spacers 208. A silicide layer 128 is formed directly on an upper region of source/drain regions 124, 126 while the pairs of the select gates 106 and memory gates 112 are covered to prevent formation of silicide. A first dielectric layer 1602, for example a low-k material, is formed to fill spaces over the silicide layer 128 and cover the workpiece. A planarization is performed and stops at the select gates 106. As shown in cross-sectional view 1700, a second dielectric layer 1702, such as a silicon dioxide or low-k dielectric layer, is formed over the planarized workpiece, and contacts 216 are formed through the first and second dielectric layers 1602, 1702 extending to the source/drain regions 124, 126.

Thus, as can be appreciated from above, the present disclosure provides a self-aligned split gate memory cell having a select gate and a memory gate separated by a charge trapping layer extending under the memory gate. The memory gate can be formed by etching back a memory gate material to achieve a lowered planar top surface. Thus the memory gate has an easy controlled height and is well defined to prevent leakage. A memory gate spacer then can be formed easily overlying the lowered memory gate material. The memory gate is then defined self-aligned by the memory gate spacer. An outermost portion of the memory gate spacer is consumed during some etching processes followed, such that an outer sidewall of the memory gate spacer is laterally recessed back from an outer sidewall of the memory gate, exposing an outer portion of the memory gate's top surface to a dielectric liner formed thereafter. The disclosed device and method are also capable of further scaling since process window is wider than previous approaches. The present disclosure also provides a pair of split gate memory cells disposed over a semiconductor substrate. The pair of split gate memory cells could comprise a common source/drain region shared by the memory cells. The pair of split gate memory cells correspondingly comprises a pair of select gates and a pair of memory gates symmetrically arranged on opposite sides of the common source/drain region. The memory gates are arranged about opposite sides of the pair of select gates respectively, each of the memory gates separated from the corresponding select gates by a charge trapping layer extending under each of the memory gates. Each of the split gate memory cells can have a structure as described above.

In some embodiments, the present disclosure relates to a split gate memory cell. The split memory cell comprises a select gate disposed over a semiconductor substrate, separated therefrom by a gate dielectric layer. The split memory cell further comprises a memory gate arranged at one side of the select gate and a charge trapping layer having a vertical portion disposed between neighboring sidewalls of the select gate and the memory gate and a lateral portion extending under the memory gate. The split memory cell further comprises source/drain regions disposed in the semiconductor substrate at opposite sides of the select gate and the memory gate. The split memory cell further comprises a memory gate spacer arranged directly above the memory gate having a lateral dimension smaller than that of the memory gate. The memory gate spacer has an inner sidewall disposed along an upper portion of the charge trapping layer and an outer sidewall recessed back laterally relative to an outer sidewall of the memory gate. The split memory cell further comprises a dielectric liner continuously lining the outer sidewall of the memory gate, extending on a portion of a top surface of the memory gate not covered by the memory gate spacer, and extending upwardly along the outer sidewall of the memory gate spacer.

In other embodiments, the present disclosure relates to a pair of split gate memory cells disposed over a semiconductor substrate. The pair of split gate memory cells comprises a common source/drain region shared by the memory cells. The pair of split gate memory cells further comprises a pair of select gates corresponding to the pair of memory cells respectively arranged on opposite sides of the common source/drain region, each of the select gates having a planar upper surface. The pair of split gate memory cells further comprises a pair of memory gates corresponding to the pair of memory cells arranged about opposite sides of the pair of select gates respectively, each of the memory gates being a cuboid shape and having planar upper surface and sidewalls. The pair of split gate memory cells further comprises a charge trapping layer separating each of the memory gates from the corresponding select gates and extending under each of the memory gates. The pair of split gate memory cells further comprises a pair of memory gate spacers disposed directly above each of the memory gates. Inner sidewalls of the memory gate spacers are vertically aligned with inner sidewalls of the corresponding memory gates and outer sidewalls of the memory gate spacers are recessed back from outer sidewalls of the corresponding memory gates.

In yet other embodiments, the present disclosure relates to a method of forming a split gate memory cell with a self-aligned spacer. The method comprises providing a semiconductor substrate including a pair of select gates and a corresponding pair of select gate masks disposed thereover. The method further comprises forming a conformal charge trapping layer over an upper surface of the semiconductor substrate, along select gate sidewalls, along select gate mask sidewalls, and over upper surfaces of the select gate masks. The method further comprises forming a memory gate material over portions of the conformal charge trapping layer which overlie the upper surface of the semiconductor substrate. The memory gate material leaves upper sidewalls of the charge trapping layer exposed. The method further comprises forming a pair of memory gate spacers along the upper sidewalls of the charge trapping layer over the memory gate material. The method further comprises patterning the memory gate material using the pair of memory gate spacers as a memory gate mask, thereby forming a pair of memory gates about opposite sides of the pair of select gates, vertically aligned with the memory gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A split gate memory cell, comprising:
   a select gate disposed over a semiconductor substrate, separated therefrom by a gate dielectric layer;
   a memory gate arranged at one side of the select gate;
   a charge trapping layer having a vertical portion disposed between neighboring sidewalls of the select gate and the memory gate and a lateral portion extending under the memory gate;
   source/drain regions disposed in the semiconductor substrate at opposite sides of the select gate and the memory gate;
   a memory gate spacer arranged directly above the memory gate having a lateral dimension smaller than that of the memory gate, wherein the memory gate spacer has an inner sidewall disposed along an upper portion of the charge trapping layer and an outer sidewall recessed back laterally relative to an outer sidewall of the memory gate;
   a dielectric liner continuously lining the outer sidewall of the memory gate, extending on a portion of a top surface of the memory gate not covered by the memory gate spacer, and extending upwardly along the outer sidewall of the memory gate spacer; and
   a sidewall spacer disposed alongside the dielectric liner;
   wherein the dielectric liner extends underneath the sidewall spacer and separates the sidewall spacer from the semiconductor substrate.

2. The split gate memory cell of claim 1, wherein the memory gate spacer comprises silicon nitride (SiN).

3. The split gate memory cell of claim 1, wherein the dielectric liner comprises silicon dioxide ($SiO_2$).

4. The split gate memory cell of claim 3, further comprising:
   a SiN sidewall spacer disposed abutting an outer sidewall of the dielectric liner.

5. The split gate memory cell of claim 1,
   wherein the dielectric liner further lines another side of the select gate opposite the memory gate;
   wherein the sidewall spacer covers outer sidewalls of the dielectric liner.

6. The split gate memory cell of claim 5, wherein upper surfaces of the sidewall spacer, the dielectric liner, the memory gate spacer, the charge trapping layer are co-planar with the upper surface of the select gate.

7. The split gate memory cell of claim 6, wherein the sidewall spacer sits on the dielectric liner.

8. The split gate memory cell of claim 1, wherein the charge trapping layer comprises:
a nitride layer sandwiched between a first dielectric layer and a second dielectric layer, wherein the first dielectric layer abuts an upper surface of the semiconductor substrate and the select gate and the second dielectric layer abuts the memory gate and the memory gate spacer.

9. The split gate memory cell of claim 1, wherein the charge trapping layer comprises:
a layer of sphere-like silicon dots randomly arranged between a first dielectric layer and a second dielectric layer, wherein the first dielectric layer abuts an upper surface of the semiconductor substrate and the select gate and the second dielectric layer abuts the memory gate and the memory gate spacer.

10. The split gate memory cell of claim 1, wherein the lateral portion of the charge trapping layer has a sidewall aligned with the outer sidewall of the memory gate and covered by the dielectric liner.

11. A pair of split gate memory cells disposed over a semiconductor substrate, comprising:
a common source/drain region shared by the pair of memory cells disposed in the semiconductor substrate;
a pair of select gates corresponding to the pair of memory cells respectively arranged on opposite sides of the common source/drain region, each of the select gates having a planar upper surface;
a pair of memory gates corresponding to the pair of memory cells arranged about opposite sides of the pair of select gates respectively, each of the memory gates being a cuboid shape and having planar upper surface and sidewalls;
a charge trapping layer separating each of the memory gates from the corresponding select gates and extending under each of the memory gates;
a pair of memory gate spacers disposed directly above each of the memory gates, wherein inner sidewalls of the memory gate spacers are vertically aligned with inner sidewalls of the corresponding memory gates and outer sidewalls of the memory gate spacers are recessed back from outer sidewalls of the corresponding memory gates;
a pair of dielectric liners disposed along outer sidewalls of the pair of the memory gates and select gates, extending on a portion of upper surfaces of the memory gates not covered by the memory gate spacers, and extending upwardly to cover outer sidewalls of the memory gate spacers; and
a pair of sidewall spacers disposed on the pair of dielectric liners and covering outer sidewalls of the pair of dielectric liners;
wherein the pair of sidewall spacers respectively have outermost sidewalls vertically aligned with outermost sidewalls of the pair of dielectric liners.

12. The split gate memory cells of claim 11, wherein a height of the pair of the select gates is greater than that of the pair of the memory gates.

13. The split gate memory cells of claim 11, wherein the pair of dielectric liners abut the outer sidewalls of the pair of the memory gates and select gates.

14. The split gate memory cells of claim 13, wherein the pair of sidewall spacers have an upper portion with a greater lateral dimension than a lower portion.

15. The split gate memory cells of claim 11, further comprising:
a silicide layer disposed over the common source/drain region; and
a contact etch stop layer (CESL) disposed over the silicide layer and exposed surfaces of the split gate memory cell.

16. A split gate memory cell, comprising:
source/drain regions disposed within a semiconductor substrate;
a select gate with a cuboid shape disposed between the source/drain regions and over the semiconductor substrate, the select gate separated from the semiconductor substrate by a gate dielectric layer;
a memory gate with a cuboid shape arranged at one side of the select gate;
a charge trapping layer comprising a charge trapping component sandwiched between a lower oxide layer and an upper oxide layer, the charge trapping layer disposed between the select gate and the memory gate and extending under the memory gate;
a memory gate spacer arranged on the memory gate having an inner sidewall disposed along an upper portion of the charge trapping layer and an outer sidewall recessed back laterally relative to an outer sidewall of the memory gate; and
a dielectric liner comprising a single layer having a lower vertical portion and an upper vertical portion connected by a lateral portion, wherein the lower vertical portion lines the outer sidewall of the memory gate, the lateral portion extends along a portion of a top surface of the memory gate not covered by the memory gate spacer, and the upper vertical portion extends upwardly along the outer sidewall of the memory gate spacer.

17. The split gate memory cell of claim 16, wherein the memory gate spacer comprises silicon nitride (SiN) and the dielectric liner comprises silicon dioxide ($SiO_2$).

18. The split gate memory cell of claim 16, further comprising:
a sidewall spacer disposed over an extended portion of the lower oxide layer, along the lower vertical portion of the dielectric liner, continuously extended on the lateral portion of the dielectric liner, and along the upper vertical portion of the dielectric liner.

19. The split gate memory cell of claim 18, wherein the dielectric liner and the sidewall spacer line another side of the select gate opposite the memory gate, and a sidewall spacer covers outer sidewalls of the dielectric liner.

20. The split gate memory cell of claim 18, wherein upper surfaces of the sidewall spacer, the dielectric liner, the memory gate spacer, and the charge trapping layer are coplanar with the upper surface of the select gate.

* * * * *